(12) United States Patent
Kim et al.

(10) Patent No.: US 6,454,472 B1
(45) Date of Patent: Sep. 24, 2002

(54) SEMICONDUCTOR MANUFACTURING APPARATUS FOR PHOTOLITHOGRAPHIC PROCESS

(75) Inventors: Dong-Ho Kim; Hee-Young Kang; Ki-Sung Cho, all of Chonan (KR)

(73) Assignee: DNS Korea Co., Ltd. (KR)

( * ) Notice: Subject to any disclaimer, the term of this patent is extended or adjusted under 35 U.S.C. 154(b) by 0 days.

(21) Appl. No.: 09/693,409

(22) Filed: Oct. 19, 2000

(30) Foreign Application Priority Data

Dec. 6, 1999 (KR) ............................................ 99-55236

(51) Int. Cl.[7] ................................................. G03D 5/00
(52) U.S. Cl. ........................ 396/611; 414/940; 134/902
(58) Field of Search ........................ 396/611; 29/25.01; 134/902; 414/935, 940; 427/240; 118/52, 56, 319–321, 666–668; 355/30

(56) References Cited

U.S. PATENT DOCUMENTS 5,919,529 A * 7/1999 Matsumura ................. 134/902
5,937,223 A * 8/1999 Akimoto ..................... 396/611
5,963,753 A * 10/1999 Ohtani et al. ............... 396/611

* cited by examiner

Primary Examiner—Della J. Rutledge
(74) Attorney, Agent, or Firm—Marger Johnson & McCollom, P.C.

(57) ABSTRACT

A semiconductor manufacturing apparatus for a photolithographic process having a coating process and a developing process is described, which includes a first port, a second port, a coating member, and a developing member. The first port and second port have a constant distance from each other, where a substrate comes in and goes out. The coating member, which couples the first port to the second port, carries the substrate between the first port and the second port and carries out the coating process. The developing member, which couples the first port to the second port and is stacked on the coating member, carries the substrate therebetween and carries out the developing process. The apparatus can stably maintain an operating ratio of equipment, and be installed in a relatively small area.

9 Claims, 6 Drawing Sheets

SEMICONDUCTOR MANUFACTURING APPARATUS FOR PHOTOLITHOGRAPHIC PROCESS

This application relies for priority upon Korean Patent Application No. 1999-55236, filed on Dec. 6, 1999, the contents of which are herein incorporated by reference in their entirety.

FIELD OF THE INVENTION

The present invention relates to a semiconductor manufacturing device and, more particularly, to a semiconductor manufacturing apparatus for a photolithographic process including a coating process and a developing process.

BACKGROUND OF THE INVENTION

A variety of steps are applied to a semiconductor manufacturing process, forming an electric circuit on a substrate such as a semiconductor substrate, a glass substrate, and a liquid crystal panel. Photolithography is classified into a coating process, an exposure process, and a developing process. In the coating process, a photoresist (PR) is conformally coated on a surface of the substrate. Light passes a circuit pattern drawn on a mask using a stepper, exposing the circuit pattern to the substrate on which a photoresist layer is formed, in the exposure process. A layer of a light-receiving portion is developed in the developing process.

FIGS. 1–2 schematically illustrate one and another example of a conventional semiconductor manufacturing apparatus for a photolithographic process, respectively.

Referring now to FIG. 1, a semiconductor manufacturing apparatus 200 for a photolithographic process includes a port 210 where a substrate is loaded/unloaded, a spin coater (SCW) 220 for coating a photoresist onto the substrate, a spin developer (SDW) 230 for developing the substrate, a bake unit (BAKE) 240 for heating up the substrate, a wide expose edge wafer (WEEW) 250 for exposing unnecessary photoresist around a circumference of the substrate. The foregoing units are horizontally arranged according to process flow, and divided at both sides of a central path 260. A robot 270, placed in the path 260, carries the substrate to the port 210, an interface 280, or each of the process units. The interface 280 is a port where an exposure system 150 and the substrate comes in and goes out.

Referring now to FIG. 2, similar to the apparatus 200, a semiconductor manufacturing apparatus 300 includes a port 310, a spin coater (SCW) 320, a spin developer (SDW) 330, a bake unit (BAKE) 340, and a wide expose edge wafer (WEEW) 350. The foregoing units are divided at both sides of central paths 360 and 380. To increase operating ratio in comparison with the apparatus 200, the semiconductor manufacturing apparatus 300 utilizes two robots 370 and 390 as a carrier for carrying a substrate. Units for a coating process and units for a developing process are horizontally arranged. A robot is arranged in the coating units and developing units, respectively. A first interface 400 is arranged therebetween. A robot 370 of a coating process region carries a substrate to the port 310, the first interface 400, or each process unit of the coating process region. A robot 390 of a developing process region carries the substrate to the first interface 400, the second interface 410, or each process unit of the developing process. The second interface 410 is a port where the exposure system 150 and the substrate come in and go out.

Technologies related to the foregoing semiconductor manufacturing apparatus are disclosed in U.S. Pat. No. 5,399,531, issued by Wu.

Increasing the operating ratio is subject to limitation. In the semiconductor manufacturing apparatus 200 and 300, a coated substrate is carried to an exposure system and, thereafter, the substrate exposed in the exposure system is developed and outwardly carried. Based upon proceeding order of the photolithography, a substrate can sequentially be carried. If a process of one unit is stagnated, a process of others can be stagnated to drop the operating ratio. If only one specific process (e.g., developing process) requires performing, the operating ratio can also be dropped because other units should be carried through a path where they are arranged. Adding each of the units to the apparatus 300 shown in FIG. 2 from the apparatus 200 shown in FIG. 1 causes increase in an equipment area. This cannot achieve practical increase in the operating ratio. Merely, processing units are increased to raise the operating ratio.

SUMMARY OF THE INVENTION

It is therefore an object of the invention to provide a semiconductor manufacturing apparatus for a photolithographic process, which can maximize an operating ratio of equipment.

It is another object of the invention to provide a semiconductor manufacturing apparatus for a photolithographic process, which can be installed with a relatively small area and easily apply a new process.

According to the invention, a semiconductor manufacturing apparatus for a photolithographic process having a coating process and a developing process includes a first port, a second port, a coating unit, and a developing unit. In the first and second ports, a substrate comes in and goes out. There is a constant distance between the first and second substrates. The coating unit is installed to couple the first port to the second port, carry the substrate therebetween, and perform a coating process. The developing unit is opposite to the coating module to couple the first port to the second port, carry the substrate therebetween, and perform a developing operation.

The coating unit is composed of: a first path for coupling the first port to the second port; a coating module installed along one side of the first path; and a first carrier, moving between the first and the second ports through the first path, for carrying the substrate to the first port, the second port, or the coating module. The developing unit is composed of: a second path for coupling the first port to the second port; a developing module installed along one side of the second path; and a second carrier, moving therebetween through the second path, for carrying the substrate to the first port or the second port or the developing module. In this case, the coating module includes a coater arranged at one side of the first path and a bake unit arranged at the other. The developing module includes a developer arranged at one side of the second path and a bake unit arranged at the other. The bake unit includes at least one heating plate for heating up the substrate and at least one cooling plate for cooling down the heated substrate.

The semiconductor manufacturing apparatus for a photolithographic process is coupled to an exposure system.

The coating unit and the developing unit are isolated from each other by an intermediate wall. The apparatus further includes an air-conditioning apparatus, installed at the intermediate wall, for removing particles created in the coating unit and the developing unit.

The coating process and the developing process are separately performed to scarcely cause process stagnation. In particular, it is possible to efficiently remove stagnation caused by carrying the substrate. Making the most use of the units is to create a stable operating ratio of equipment. The units are stacked, thereby reducing an installation area and easily applying a new or additional process.

A further understanding of the nature and advantage of the invention herein may be realized by reference to the remaining portions of the specification and the attached drawings.

DESCRIPTION OF THE PREFERRED EMBODIMENT

Now, the present invention will be described more fully hereinafter with reference to attached drawings wherein the same numerals denote the same components.

Figure 1:
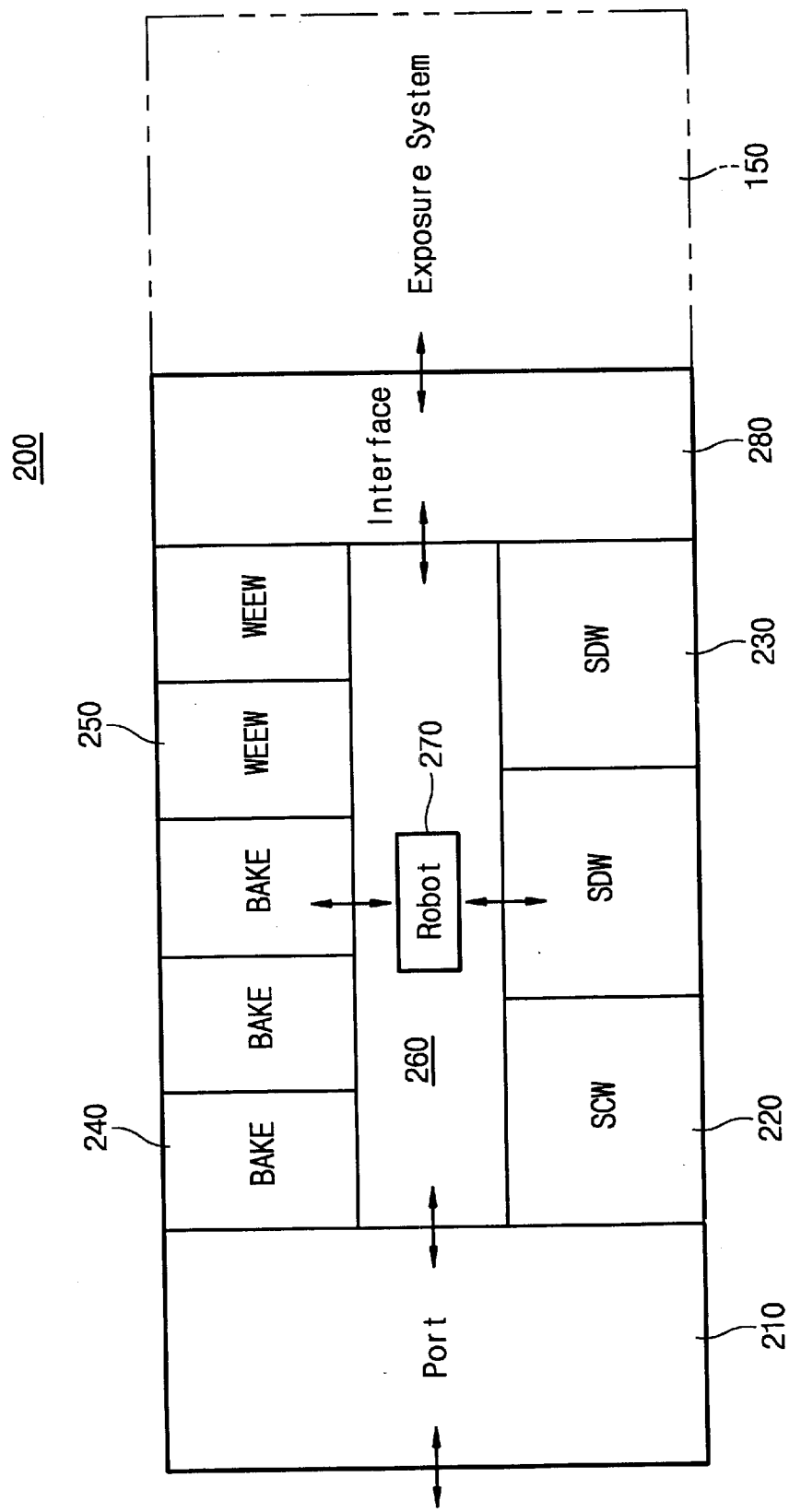
FIG. 1 is a block diagram for illustrating one example of a semiconductor manufacturing apparatus for a photolithographic process in accordance with a prior art.
Figure 2:
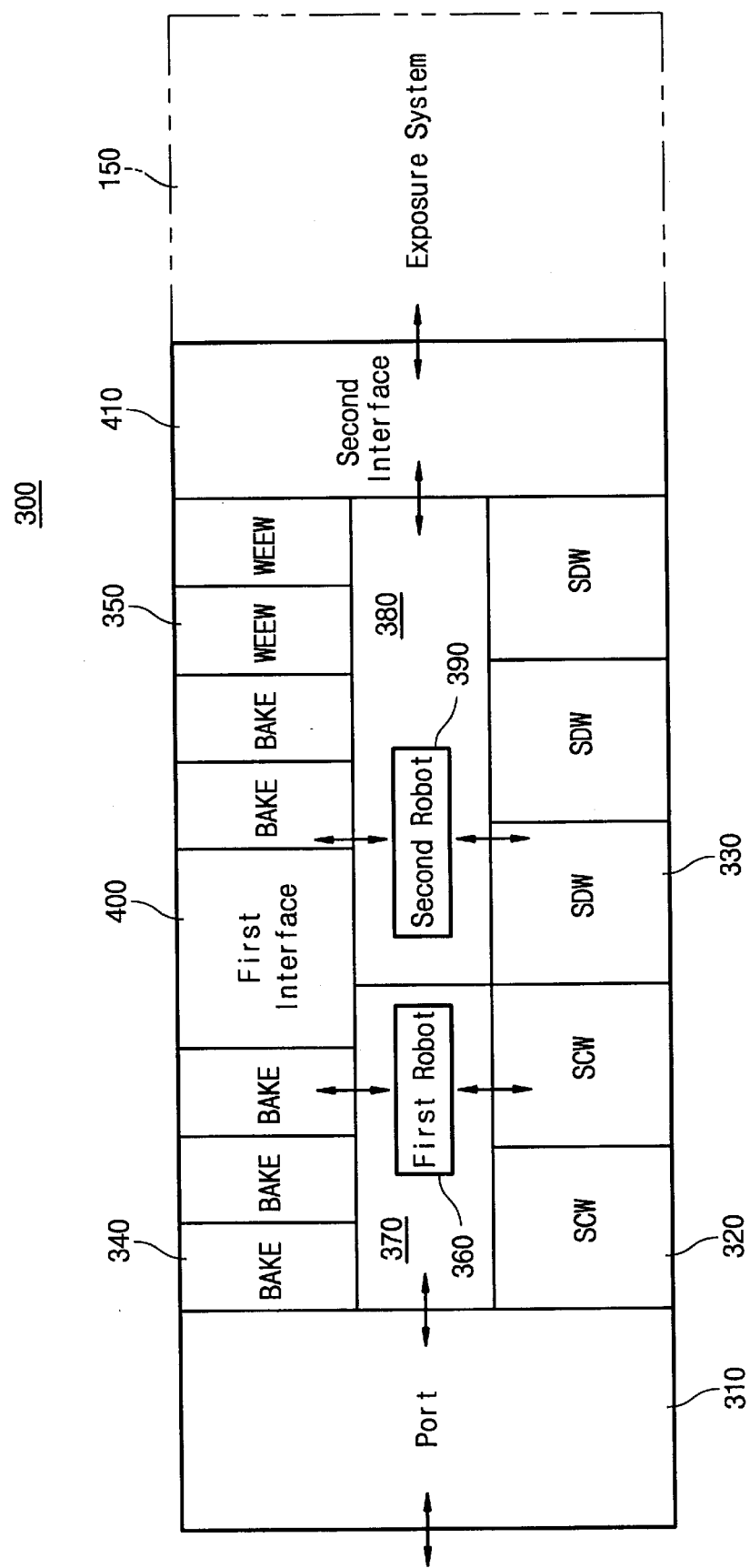
FIG. 2 is a block diagram for illustrating another example of a semiconductor manufacturing apparatus for a photolithographic process in accordance with a prior art.
Figure 3:
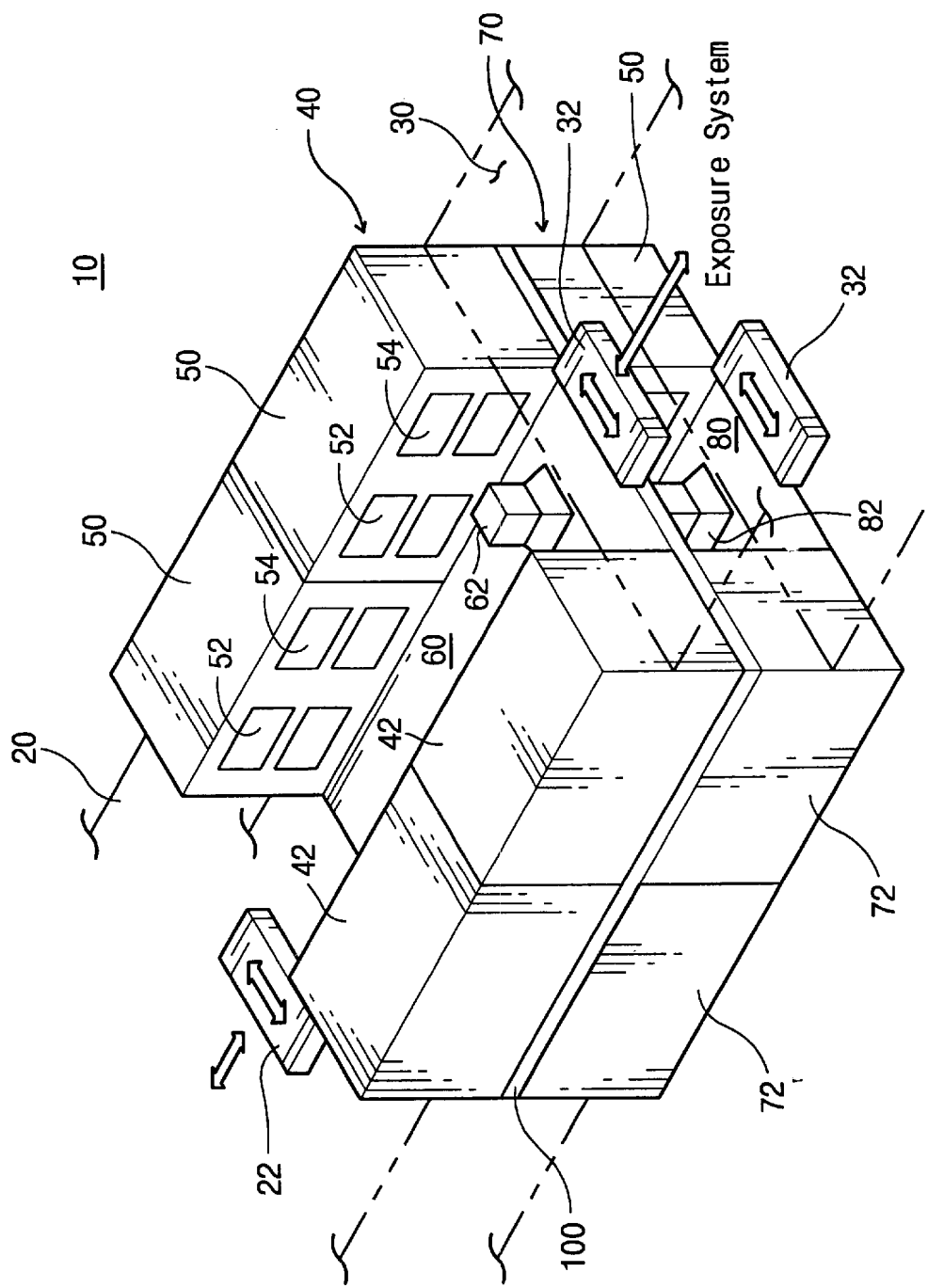
FIG. 3 is a block diagram for illustrating a semiconductor manufacturing apparatus in accordance with the invention.
Figure 4:
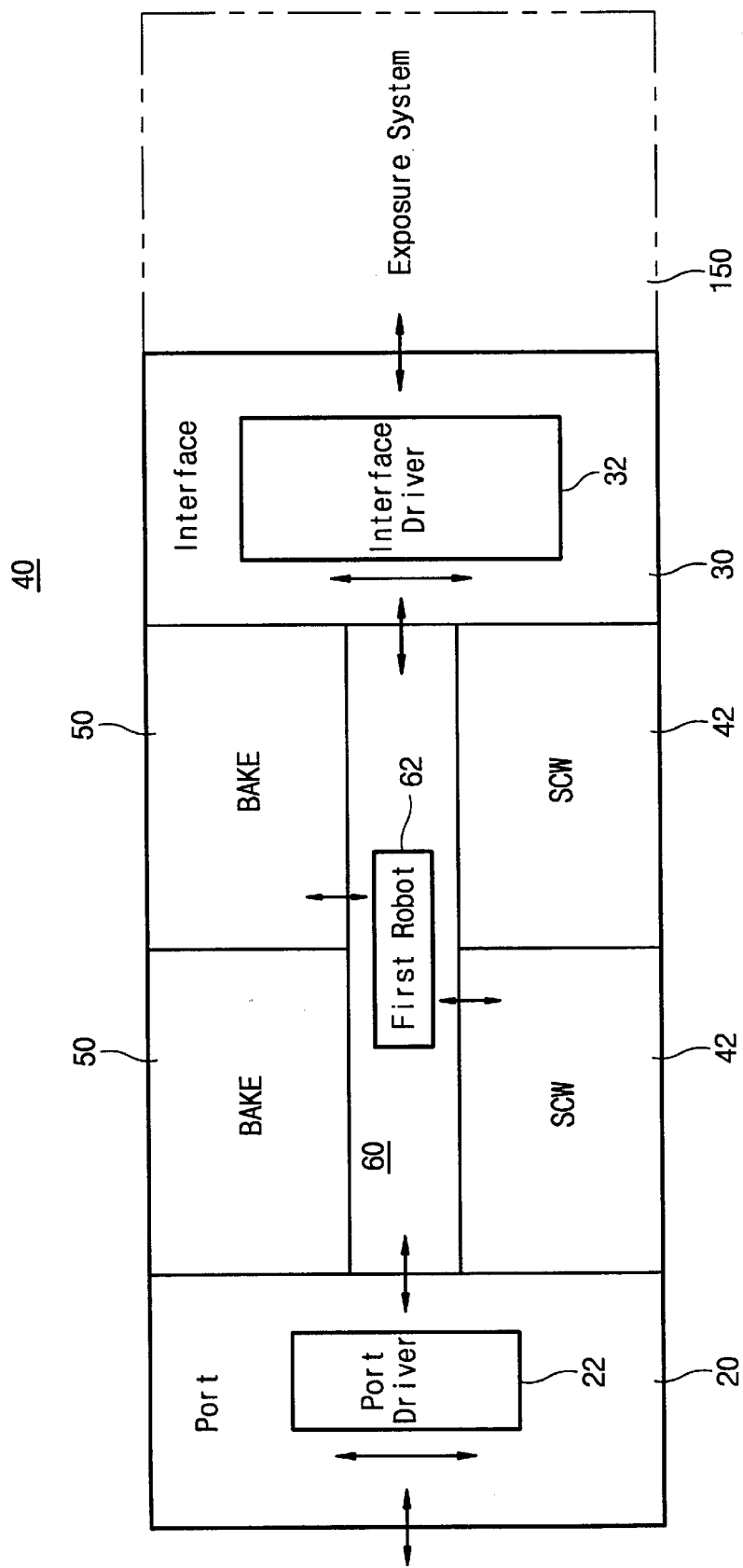
FIG. 4 is a top plan view of a semiconductor manufacturing apparatus shown in FIG. 3.
Figure 5:
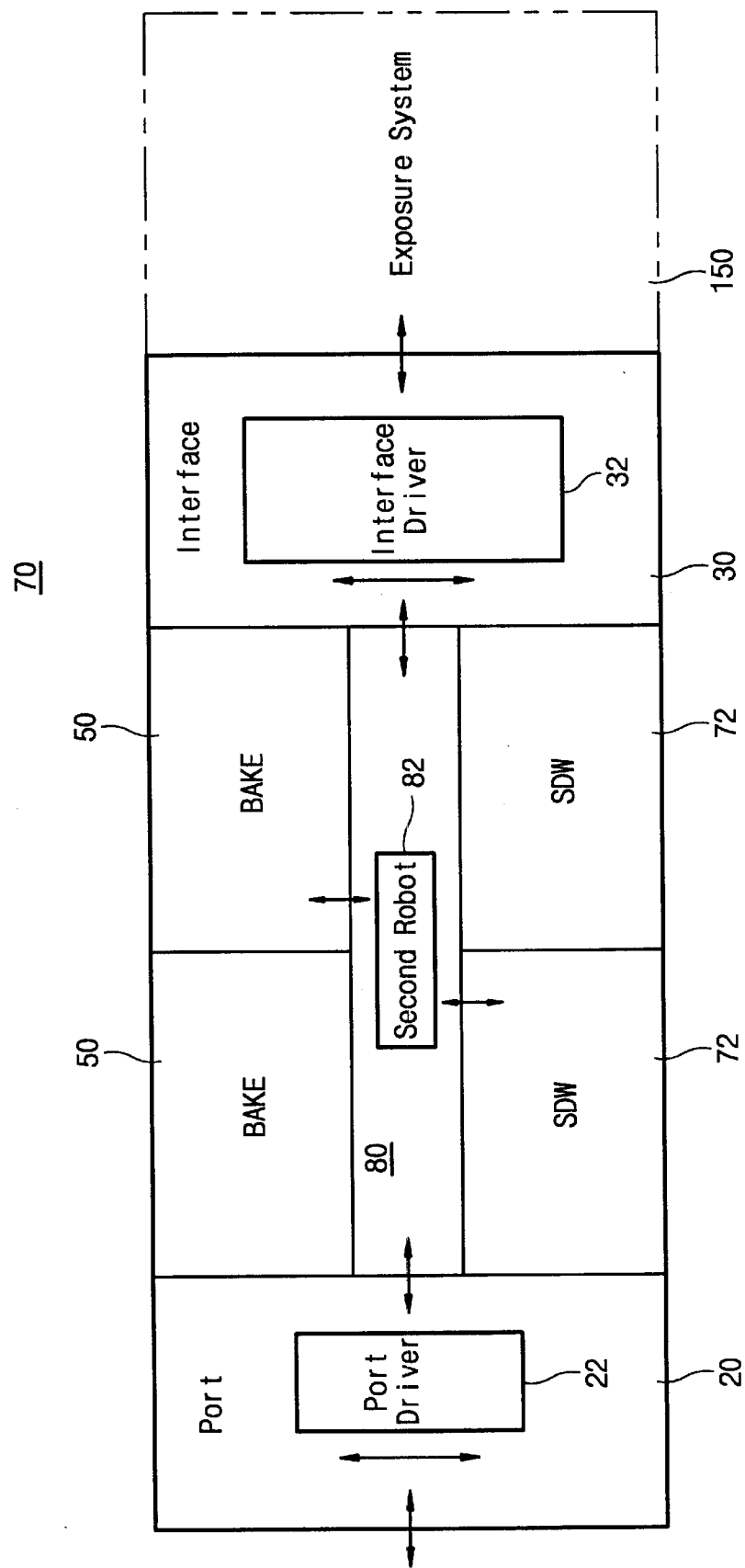
FIG. 5 is a bottom view of a semiconductor manufacturing apparatus shown in FIG. 3.

Referring now to FIGS. 3–5, a semiconductor manufacturing apparatus 10 includes a coating module 40 which is composed of units for carrying out a developing process, and a developing module 70 which is composed of units for carrying out a developing process. In this embodiment, the coating module 40 is arranged on an upper layer and the developing module 70 is arranged on a lower layer. Moreover, it is naturally possible that the coating module 40 is arranged on the lower layer and the developing module 70 is arranged on the upper layer. A multi-layer (more than two layers) structure may be applied. A path and a carrier for carrying a substrate are separately made to separately perform the coating process and the developing process. That is, a first path 60 for carrying the substrate through the coating module 40 is arranged along the coating module 40, and a second path 80 for carrying the substrate through the developing module 70 is arranged along the developing module 70. A variety of types may be applied to the arrangements of the coating module 40 to the first path 60, and of the developing module 70 to the second path 80. In this embodiment, the coating module 40 is arranged at both sides of the first path 60 and the developing module 70 is arranged at both sides of the second path 80. The upper layer and lower layers are isolated from each other by an intermediate wall 100, which is generally an interlayer wall. An air-conditioning apparatus for removing particles created in the upper layer and/or the lower layer may be installed at the intermediate wall 100. Because technology for installing the air-conditioning apparatus is well-known by those skilled in the art, description thereof will be skipped herein. A first robot 62, which is located at the first path 60, serves as a carrier for carrying the substrate by moving along the first path 60. A second robot 82, which is located at the second path 80, serves as a carrier for carrying the substrate by moving along the second path 80. The semiconductor manufacturing apparatus 10 can freely carry the substrate to the port 20 where the substrate is loaded/unloaded, and between the exposure system 150 and the interface 30.

Referring to FIGS. 3–5 again, the semiconductor manufacturing apparatus 10 has two ports where a substrate comes in and goes out. One is a port 20 where the apparatus 10 carries out a photolithographic process or a specific process. The other is an interface 30 having a constant distance from the port 20. A port driver 22 is installed in the port 20 and an interface driver 32 is installed in the interface 30, smoothly carrying the substrate. The port driver 22 and the interface driver 32 correspond to both a robot of the upper layer and that of the lower layer or correspond to the robots, respectively. In this embodiment, the port 20 and the interface 30 can carry both a substrate of the upper layer and that of the lower layer using one driver 22 and 32, respectively. Naturally, those skilled in the art can apply a variety of types thereof.

The coating module 40, the first path 60, and the first robot 62, which couple the port 20 to the interface 30, serve as a coating unit for carrying the substrate therebetween and performing a coating process. The developing module 70, the second path 80, and the second robot 82, which are stacked on the coating unit in line and couple the port 20 to the interface 30, serve as a developing unit for carrying the substrate therebetween and performing a developing process.

Conventionally, although only a developing process requires carrying out, a substrate should be carried through a region of a coating process. This invention solves such a problem, maximizing efficiency of the process.

Figure 6:
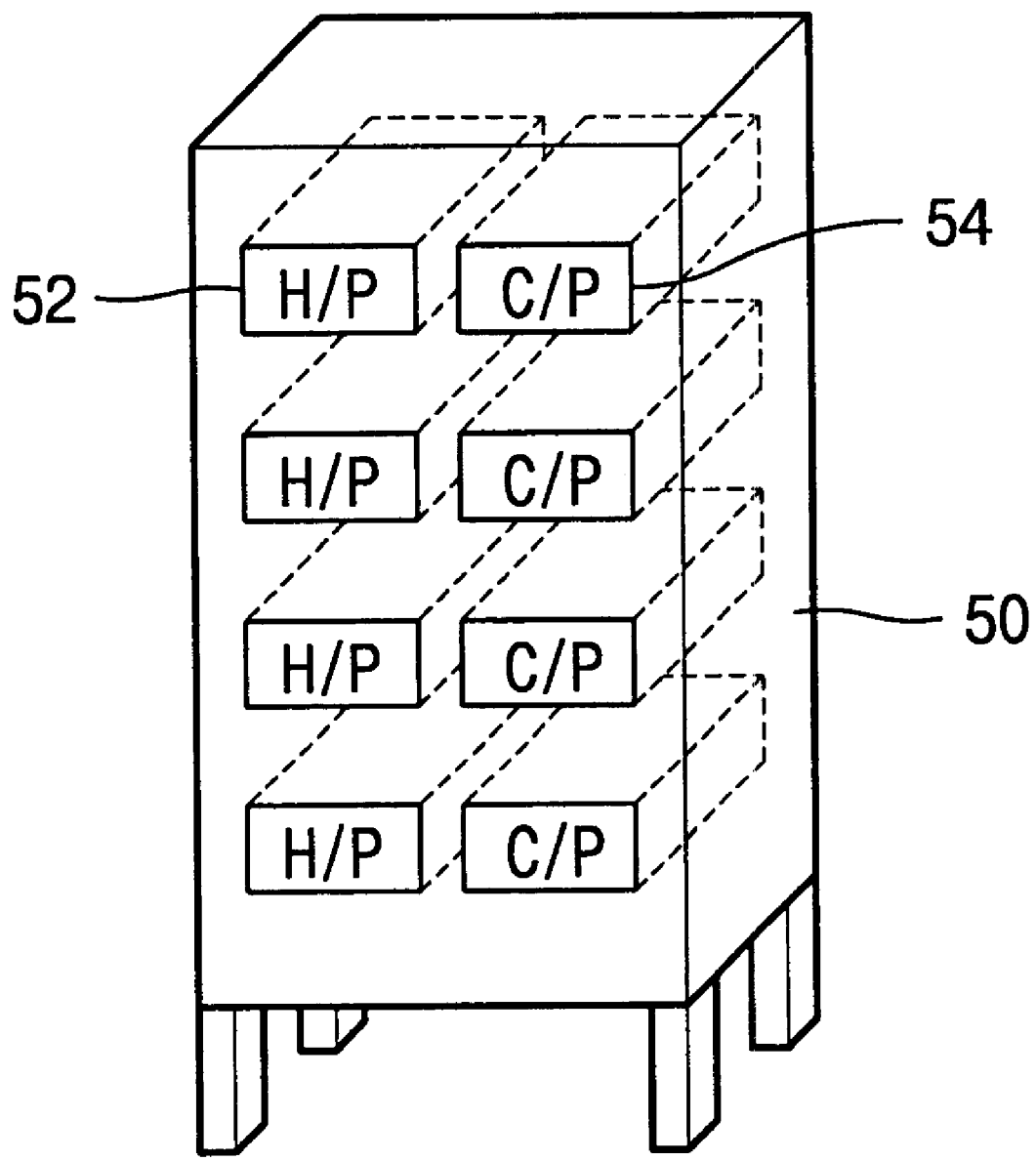
FIG. 6 is a perspective view for schematically showing one example of a bake unit applied to a semiconductor manufacturing apparatus shown in FIG. 3.

Referring now to FIGS. 4–6, the semiconductor manufacturing apparatus 10 has the above-described architecture wherein units composing the coating module 40 are arranged at both sides of the first path 60 and unit composing the developing module 70 are arranged at both sides of the second path 80. In the coating module 40, as shown in FIG. 4, a bake unit 50 is installed at one side of the first path 60 and a coater 42 is installed at the other. In the developing module 70, as shown in FIG. 5, the bake unit 50 is installed at one side of the second path 80 and a developer 72 is installed at the other. The composing units of the modules 40 and 70 can be controlled by a size of the substrate. Various diameters such as 6, 8, 12, 15, and 15 inches have been applied to a wafer, and a size thereof is steadily growing. Therefore, it is necessary to consider a substrate applied to the coating module 40 and the developing module 70.

According to the semiconductor manufacturing apparatus 10 of this invention, an installation area can be reduced and a unit for a new process can easily be applied without variation of other units therein. The bake unit 50 is equipped with a heating plate (H/P) 52 for heating up a substrate and a plurality of cooling plates (C/P) 54 for cooling the heated substrate. The heating and cooling plates 52 and 54 are alternatively stacked (see FIG. 5) or are stacked in a pair (see FIGS. 6–7). For example, a type thereof is two-row and two-step or two-row and five-step.

As so far described,. a coating process and a developing process are separately performed to prevent process stagnation. Particularly, stagnation caused by carrying a substrate can efficiently be prevented. Further, the coating process and developing process are separately performed to make the most use of each unit, so that it is possible to stably maintain an operation ratio of equipment. Because each unit is stacked, it can be installed in a relatively small area and a new or additional process can easily be applied.

While particular embodiment of the present invention have been shown and described, it will be obvious to those skilled in the art that changes and modifications may be made without departing from this invention in its broader aspect and, therefore, the appended claims are to encompass within their scope all such changes and modifications as fall within the true spirit and scope of this invention.

What is claimed is:

1. A semiconductor manufacturing apparatus for a photolithographic process including a coating process and a developing process, the apparatus comprising:

a first port where a substrate comes in and goes out;

a second port, having a constant distance from the first port, where the substrate comes in and goes out;

coating means for performing the coating process; and developing means for performing the developing process, the developing means being stacked in parallel with the coating means, wherein the coating means includes:
a first conveyance path extending horizontally for coupling the first port to the second port;
a coating module arranged along one side of the first conveyance path extending horizontally; and
a first carrier, which moves between the first port and the second port via the first conveyance path, for carrying a substrate to the first port or the second port of the coating module.

2. The apparatus of claim 1, wherein the developing means includes:

a second conveyance path extending horizontally for coupling the first port to the second port;

a developing module which is arranged along one side of the second conveyance path; and a second carrier, which moves between the first port and the second port via the second conveyance path, for carrying the substrate to the first port or the second port or the developing module.

3. The apparatus of claim 2, wherein the first conveyance path and the second conveyance path extend parallel with each other.

4. The apparatus of claim 1, wherein the second port is coupled to an exposure system.

5. The apparatus of claim 1, wherein the coating means and the developing means are isolated from each other by an intermediate wall.

6. The apparatus of claim 5 further comprising an air-conditioning apparatus, which is installed at the intermediate wall, for removing particles created in the coating means and the developing means.

7. The apparatus of claim 1, wherein the coating module includes:

a coater which is arranged at one side of the first conveyance path; and a bake unit which is arranged at the other side of the first conveyance path and opposite to the coater.

8. The apparatus of claim 7, wherein the bake unit includes:

at least one heating plate for heating up a substrate; and at least one cooling plate for cooling down the heated substrate.

9. The apparatus of claim 7, wherein the developing module includes:

a developer which is arranged at one side of the second conveyance path; and a bake unit which is arranged at the other side of the second conveyance path and opposite to the developer.

* * * * *

(12) EX PARTE REEXAMINATION CERTIFICATE (8748th)
United States Patent
Kim et al.

(10) Number: US 6,454,472 C1
(45) Certificate Issued: Dec. 13, 2011

(54) SEMICONDUCTOR MANUFACTURING APPARATUS FOR PHOTOLITHOGRAPHIC PROCESS

(75) Inventors: Dong-Ho Kim, Chonan (KR); Hee-Young Kang, Chonan (KR); Ki-Sung Cho, Chonan (KR)

(73) Assignee: Semes Co. Ltd, Upsung-dong, Chonan-shi, Chungcheongnam-do (KR)

Reexamination Request:
No. 90/008,321, Feb. 15, 2007

Reexamination Certificate for:
Patent No.: 6,454,472
Issued: Sep. 24, 2002
Appl. No.: 09/693,409
Filed: Oct. 19, 2000

(30) Foreign Application Priority Data

Dec. 6, 1999 (KR) .............................. 99-55236

(51) Int. Cl.
*G03F 7/16* (2006.01)
*G03F 7/20* (2006.01)
*G03F 7/30* (2006.01)
*B05C 13/02* (2006.01)
*G03D 5/00* (2006.01)
*H01L 21/027* (2006.01)

(52) U.S. Cl. .................. 396/611; 134/902; 414/940
(58) Field of Classification Search .................. None
See application file for complete search history.

(56) References Cited

To view the complete listing of prior art documents cited during the proceeding for Reexamination Control Number 90/008,321, please refer to the USPTO's public Patent Application Information Retrieval (PAIR) system under the Display References tab.

*Primary Examiner* — Erik Kielin

(57) ABSTRACT

A semiconductor manufacturing apparatus for a photolithographic process having a coating process and a developing process is described, which includes a first port, a second port, a coating member, and a developing member. The first port and second port have a constant distance from each other, where a substrate comes in and goes out. The coating member, which couples the first port to the second port, carries the substrate between the first port and the second port and carries out the coating process. The developing member, which couples the first port to the second port and is stacked on the coating member, carries the substrate therebetween and carries out the developing process. The apparatus can stably maintain an operating ratio of equipment, and be installed in a relatively small area.

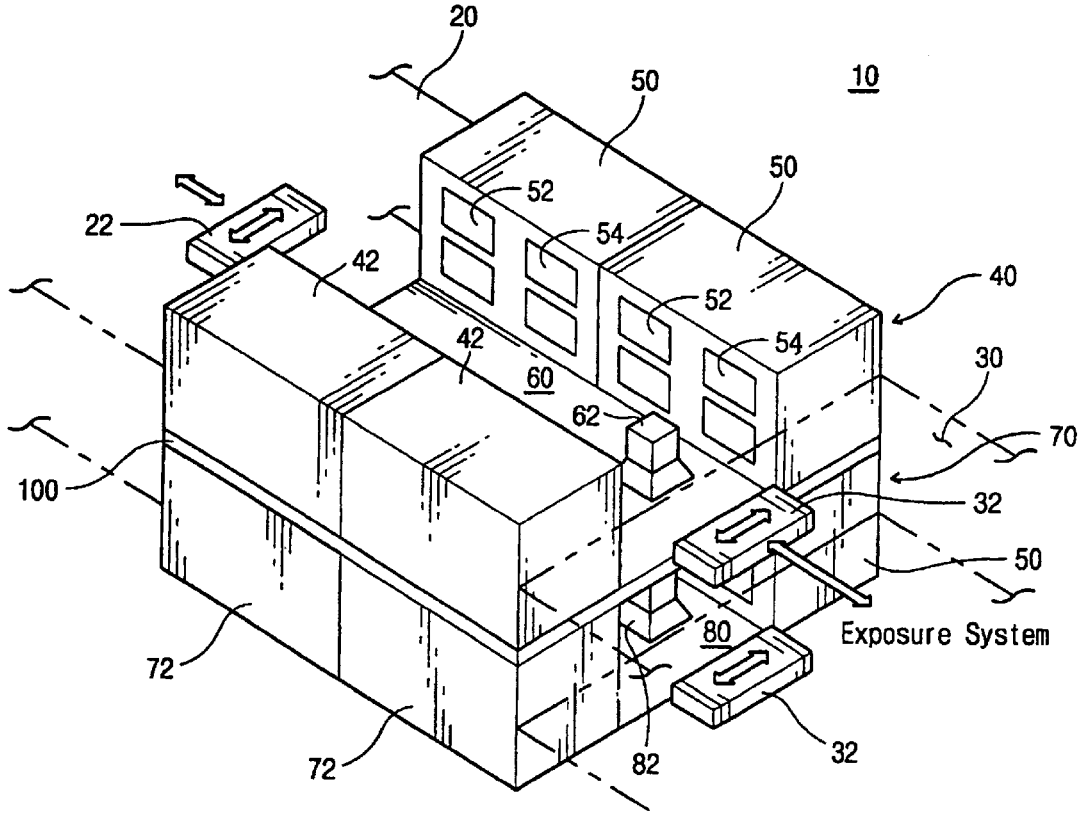

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-9 are cancelled.

* * * * *